(12) United States Patent
Kiran et al.

(10) Patent No.: US 7,969,334 B2
(45) Date of Patent: Jun. 28, 2011

(54) APPARATUS FOR CORRECTING SETTING ERROR IN AN MDAC AMPLIFIER

(75) Inventors: Ganesh Kiran, Bangalore (IN); Visvesvaraya A. Pentakota, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/645,220

(22) Filed: Dec. 22, 2009

(65) Prior Publication Data

US 2011/0102216 A1  May 5, 2011

(51) Int. Cl.
*H03M 1/06* (2006.01)

(52) U.S. Cl. ........ 341/118; 341/120; 341/122; 341/155; 341/161

(58) Field of Classification Search .......... 341/118–122, 341/155, 161
See application file for complete search history.

(56) References Cited

U.S. PATENT DOCUMENTS

| | | | |
|---|---|---|---|
| 6,323,800 B1 | 11/2001 | Chiang | |
| 6,573,791 B2 | 6/2003 | Sridhar | |
| 6,617,992 B2 * | 9/2003 | Sakurai | 341/161 |
| 7,116,255 B2 * | 10/2006 | Lee et al. | 341/144 |
| 7,230,483 B2 | 6/2007 | Chang | |
| 7,385,536 B2 * | 6/2008 | Kinyua et al. | 341/122 |
| 7,397,409 B2 * | 7/2008 | Jeon et al. | 341/156 |
| 7,486,216 B2 * | 2/2009 | Lee et al. | 341/161 |
| 7,522,085 B1 * | 4/2009 | Srinvasa et al. | 341/161 |
| 7,612,700 B2 * | 11/2009 | Kawahito et al. | 341/161 |
| 7,786,910 B2 * | 8/2010 | Ali et al. | 341/131 |
| 2002/0113726 A1 * | 8/2002 | Nagaraj | 341/156 |
| 2006/0197593 A1 | 9/2006 | Chang | |
| 2008/0068237 A1 * | 3/2008 | Jeon et al. | 341/122 |
| 2009/0146854 A1 | 6/2009 | Kawahito et al. | |
| 2010/0176977 A1 * | 7/2010 | Ranganathan et al. | 341/122 |
| 2010/0182176 A1 * | 7/2010 | Kawahito | 341/122 |

* cited by examiner

*Primary Examiner* — Linh V Nguyen
(74) *Attorney, Agent, or Firm* — John J. Patti; Wade J. Brady, III; Frederick J. Telecky, Jr.

(57) ABSTRACT

Multiplying digital-to-analog converters (MDACs), which are generally employed in pipelined analog-to-digital converters (ADCs), can have a settling error associated with the MDAC amplifier. Here, a circuit is provided that includes additional amplifiers and a capacitor network that compensates for this settling error. Thus, a more accurate pipelined ADC can now be produced.

7 Claims, 2 Drawing Sheets

APPARATUS FOR CORRECTING SETTING ERROR IN AN MDAC AMPLIFIER

CROSS-REFERENCE TO RELATED APPLICATIONS

This application claims priority from Indian Application No. 2639/CHE/2009, filed Oct. 30, 2009, which is hereby incorporated by reference for all purposes

TECHNICAL FIELD

The invention relates generally to an amplifier and, more particularly, to correcting for settling error in an amplifier employed in a multiplying digital-to-analog converter (MDAC) of a pipelined analog-to-digital converter (ADC).

BACKGROUND

Multiplying digital-to-analog converters (MDACs) are commonly used in pipelined analog-to-digital converters (ADCs). MDACs in this application generally employ switched capacitive networks and an MDAC amplifier. Turning to FIG. 1 of the drawings, a simplified, conventional MDAC amplifier with its associated capacitors can be seen. Here, an input signal VIN is applied to sampling capacitor CS (which is coupled to the inverting terminal of MDAC amplifier 102). Additionally, feedback capacitor CF is coupled between the output terminal of amplifier 102 and the inverting terminal of amplifier 102. Assuming that amplifier 102 has a good phase margin, its output would settle like a single pole system as follows:

$$VOUT = VIN * \frac{CS}{CF} * \left(1 - e^{\frac{-t}{\tau}}\right) \quad (1)$$

Of interest, however, is the output voltage VOUT at setting time of the amplifier 102

$$\left(t \approx \frac{T_S}{3}\right),$$

where $T_S$ is the clock or sample period of the ADC, so that equation (1) becomes:

$$VOUT = VIN * \frac{CS}{CF} * \left(1 - e^{\frac{-T_S}{3\tau}}\right). \quad (2)$$

This results in an error of:

$$e = VIN * \frac{CS}{CF} * e^{\frac{-T_S}{3\tau}}. \quad (3)$$

Thus, it can clearly be seen that this error shown in equation (3) increase exponentially with the decrease in the period of the ADC clock $T_S$. Therefore, there is a need to address this error.

Some other conventional circuits are: U.S. Pat. No. 6,323,800; U.S. Pat. No. 6,573,791; U.S. Pat. No. 7,230,483; U.S. Pat. No. 7,397,409; U.S. Patent Pre-Grant Publ. No. 2006/0197593; and U.S. Patent Pre-Grant Publ. No. 2009/0146854.

SUMMARY

A preferred embodiment of the present invention, accordingly, provides an apparatus. The apparatus comprises a sampling capacitor that receives an input signal; a multiplying digital-to-analog converter (MDAC) amplifier having an input terminal and an output terminal, wherein the sampling capacitor is coupled to the input terminal of the MDAC amplifier; a feedback capacitor that is coupled between the input terminal of MDAC amplifier and the output terminal of the MDAC amplifier; a correction amplifier having an input terminal and an output terminal, wherein the input terminal is coupled to correction amplifier is coupled to the output terminal of the MDAC amplifier, wherein the correction amplifier at least applies a settling gain to an output signal from the MDAC amplifier; and a correction capacitor that is coupled between the output terminal of the correction amplifier and the input terminal of the MDAC amplifier, wherein the capacitance of the correction amplifier is a fraction of the capacitance of the feedback capacitor.

In accordance with a preferred embodiment of the present invention, the correction amplifier further comprises an attenuating amplifier that attenuates the output signal from the MDAC amplifier; and a settling amplifier that applied the settling gain to the output signal from the MDAC.

In accordance with a preferred embodiment of the present invention, the setting gain is negative.

In accordance with a preferred embodiment of the present invention, an apparatus is provided. The apparatus comprises a first set of stage coupled in series with one another that receives an analog input signal, wherein the stage from the first set of stages includes: a first analog-to-digital converter (ADC); and an MDAC having: a sampling capacitor that is coupled to the first ADC; a MDAC amplifier having an input terminal and an output terminal, wherein the sampling capacitor is coupled to the input terminal of the MDAC amplifier; a feedback capacitor that is coupled between the input terminal of MDAC amplifier and the output terminal of the MDAC amplifier; a correction amplifier having an input terminal and an output terminal, wherein the input terminal is coupled to correction amplifier is coupled to the output terminal of the MDAC amplifier, wherein the correction amplifier at least applies a settling gain to an output signal from the MDAC amplifier; and a correction capacitor that is coupled between the output terminal of the correction amplifier and the input terminal of the MDAC amplifier, wherein the capacitance of the correction amplifier is a fraction of the capacitance of the feedback capacitor; a final stage that is coupled to at least one of the stages from the first set of stages, wherein the final stage includes a second ADC; and output circuitry is coupled to each of the first ADCs and to the second ADC, wherein the output circuitry outputs a digital signal.

In accordance with a preferred embodiment of the present invention, each stage from the first set of stages further comprises: a track-and-hold (T/H) amplifier that is coupled to the first ADC; an adder that is coupled to the T/H amplifier and to the MDAC; and a residue amplifier that is coupled to the adder.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 3:
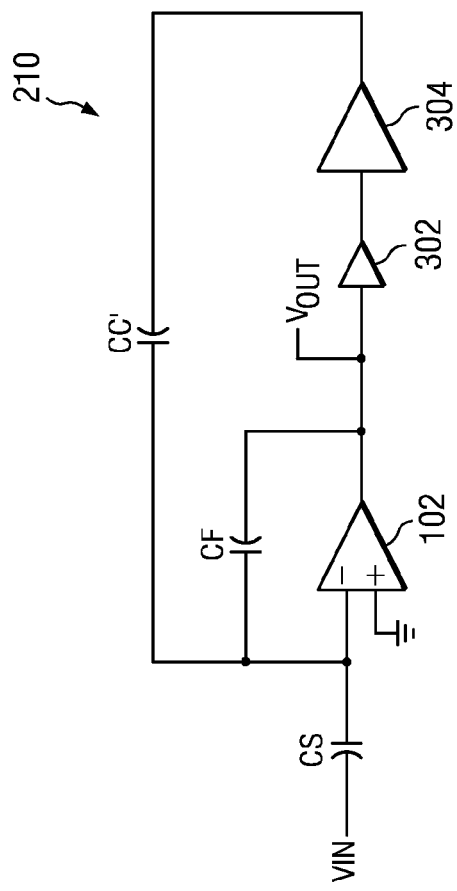
FIGS. 3 and 4 are examples of at least a portion of the MDACs of FIG. 2.

Refer now to the drawings wherein depicted elements are, for the sake of clarity, not necessarily shown to scale and wherein like or similar elements are designated by the same reference numeral through the several views.

Figure 2:
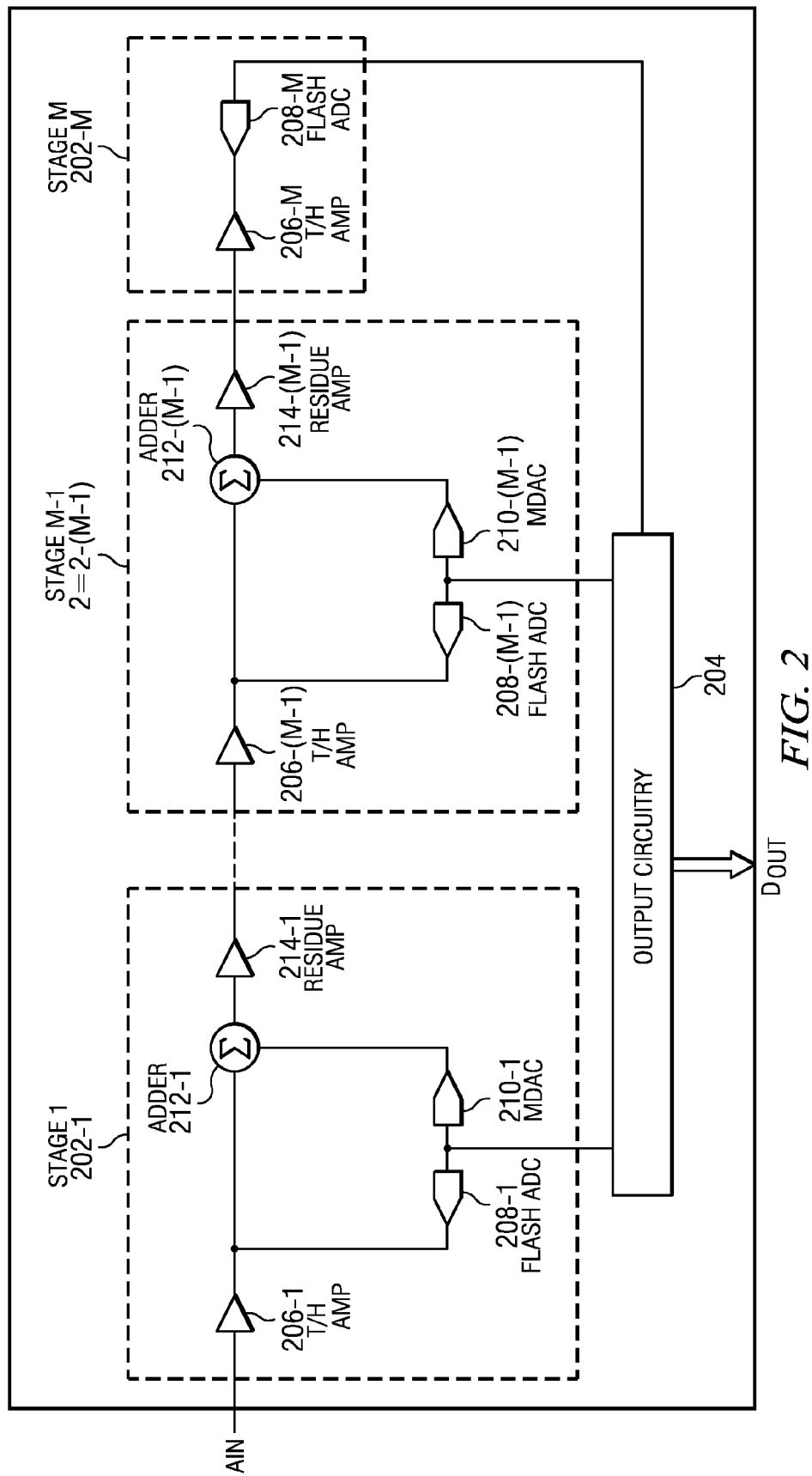
FIG. 2 is an example of a pipeline analog-to-digital converter (ADC) in accordance with a preferred embodiment of the present invention.

Referring to FIG. 2 of the drawings, the reference numeral 200 generally designates a pipelined analog-to-digital converter (ADC) in accordance with a preferred embodiment of the present invention. ADC 200 generally comprises a first set of stage 202-1 to 202-(M−1), a final or second stage 202-M, and output circuitry 204. Each of the stages 202-1 to 202-(M−1) is (respectively) generally comprised of a track-and-hold (T/H) amplifier 206-1 to 206-(M−1), a flash ADC 208-1 to 208-(M−1), an MDAC 210-1 to 210-(M−1), an adder 212-1 to 212-(M−1), and a residue amplifier 214-1 to 214-(M−1). The final or second stage 202-M is generally comprised of T/H amplifier 206-M and flash ADC 208-M. Additionally, output circuitry 204 is coupled to each of the ADCs 208-1 to 208-M to generate a digital output signal DOUT.

In operation, the ADC 200 uses the stages 202-1 to 202-M and output circuit 204 to convert the analog input signal AIN to the digital output signal DOUT. Preferably, the first stage 202-1 receives the analog input signal AIN at its T/H amplifier 206-1, where the signal AIN is sampled or tracked during a track phase and held for conversion during a hold phase. During conversion, flash ADC 208-1 performs a conversion on the sampled signal from T/H amplifier 206-1 and provides a digital signal to the output circuitry 204 and MDAC 210-1. MDAC 210-1 converts converted signal from ADC 208-1 back to an analog signal so that it can be subtracted from the sampled signal from T/H amplifier 206-1 to generate a residue signal. The residue signal is amplified by residue amplifier 214-1, so that it can be provided to the next stage 202-2. This process is repeated over the stages 202-2 to 202-(M−1), and in stage 202-M, the output from residue amplifier 214-(M−1) is sampled by T/H amplifier 206-M, which is converted to a digital signal by ADC 208-M and provided to output circuit 204.

Of interest, however, are the MDACs 210-1 to 210-(M−1), an example of a portion which can be seen in FIG. 3. Here, a portion of MDAC 210 (which is generally the same as MDACs 210-1 to 210-(M−1)) is shown including sampling capacitor CS, feedback capacitor CF, MDAC amplifier 102, a correction amplifier, and correction capacitor CC. The correction amplifier is generally comprised of an attenuating amplifier 302 (which can be a capacitive divider) with a gain K and a setting amplifier 304 with a gain of −GS. Additionally, correction capacitor CC has a capacitance that is a fraction of the capacitance of the feedback capacitor CF (CC=a*CF, where a<<1). As a result of this configuration, the output voltage VOUT from MDAC amplifier 102 is:

$$VOUT = VIN * \frac{CS}{CF*(1-a*k*GS)} * \left(1 - e^{\frac{-T_S}{3\tau}}\right) \quad (4)$$
$$= VIN * \frac{CS*(1+a*k*GS)}{CF*(1-(a*k*GS)^2)} * \left(1 - e^{\frac{-T_S}{3\tau}}\right)$$
$$\approx VIN * \frac{CS}{CF} * \left(1 - e^{\frac{-T_S}{3\tau}}\right) * (1 - a*k*GS)$$
$$\approx VIN * \frac{CS}{CF} * \left(1 - e^{\frac{-T_S}{3\tau}} + a*k*GS\right)$$

Thus, if:

$$e^{\frac{-T_S}{3\tau}} = a*k*GS \quad (5)$$

then, $$VOUT \approx VIN * \frac{CS}{CF}. \quad (6)$$

so that the error of equation (3) can be compensated for.

Typically, with ADCs (such as ADC 200), a speed dependent current $I_{TS}$ is available, which increases generally linearly with a decreasing sampling period $T_S$. Preferably, the speed dependent current is:

$$I_{TS}=I_C*(1-n*T_S), \quad (7)$$

where $I_C$ is a generally constant current. Realizing that when the same types of transistors are used for both the input and load, then the gain −GS of the settling amplifier 304 is:

$$-GS = \frac{-gm_{IN}}{gm_{LOAD}} = \frac{-\sqrt{I_{IN}}}{\sqrt{I_{LOAD}}} \quad (8)$$

So, if the input current $I_{IN}$ and load current $I_{LOAD}$ are:

$$I_{IN}=I_0+m*I_{TS} \quad (9)$$

$$I_{LOAD}=I_0-m*I_{TS}, \quad (10)$$

(where $I_0$ is a generally constant current and m is a multiplying factor), then equation (8) becomes:

$$GS = \frac{\sqrt{I_0+m*I_{TS}}}{\sqrt{I_0-m*I_{TS}}} = \frac{\sqrt{1+\frac{m*I_{TS}}{I_0}}}{\sqrt{1-\frac{m*I_{TS}}{I_0}}} = \frac{\sqrt{1+\frac{m*I_C*(1-n*T_S)}{I_0}}}{\sqrt{1-\frac{m*I_C*(1-n*T_S)}{I_0}}} \quad (11)$$

Thus, over the range of speeds of interest for ADC 200, it is possible to find a value of m such that the gain GS is exponential in nature, satisfying equation (5) and having the following form:

$$GS = e^{m*\frac{I_{TS}}{I_0}} = e^{m*\frac{I_C*(1-n*T_S)}{I_0}} = G_0 e^{-m*\frac{n*I_C*T_S}{I_0}} \quad (12)$$

Now, substituting equation (12) into equation (4), the output voltage VOUT is:

$$VOUT \approx VIN * \frac{CS}{CF} * \left(1 - e^{\frac{-T_S}{3\tau}} + a*k*GS\right) = \quad (13)$$

$$VIN * \frac{CS}{CF} * \left(1 - e^{\frac{-T_S}{3\tau}} + a*k*G_0*e^{-m*\frac{n*I_C*T_S}{I_0}}\right)$$

Therefore, the portion of the MDAC shown in FIG. 3 can accurately compensate for the settling error of equation (3) by the choice of the appropriate gain k and multiplying factor m.

From equation (13), however, it can be easily seen that gain GS exponentially increases with speed of ADC 200 (decrease in sampling period $T_S$). The output impedance of amplifier 304 should, therefore, continue to increase with speed of ADC 200, causing the bandwidth to decrease. Additionally, the time available for amplifier 304 to settle continues decreasing with speed of ADC 200. If amplifier 304 fails to settle to its expected output in the hold time of amplifier 304, the correction will be incorrect. As a result, another example of MDAC 210 (which is generally the same as MDACs 210-1 to 210-(M-1)) is shown in FIG. 4.

Figure 4:
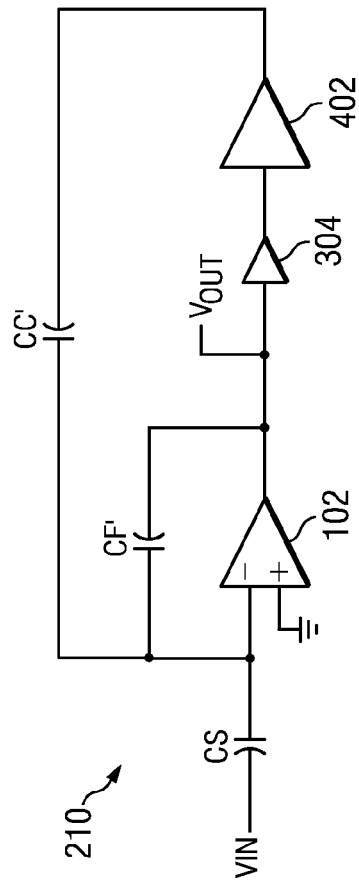
Figure 1:
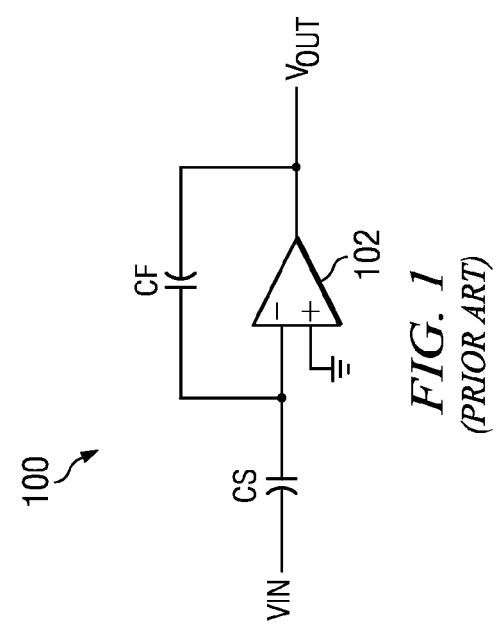
FIG. 1 is an example of a conventional multiplying digital-to-analog converter (MDAC) amplifier and its associated capacitors.

In FIG. 4, an adjustment is made to the feedback capacitor CF and the correction capacitor CC of FIG. 3, yielding feedback capacitor CF', correction capacitor CC', and settling amplifier 402. This adjustment results in the closed loop gain of amplifier 102 of FIG. 4 being:

$$ClosedLoopGain = \frac{C_S}{C'_f} \approx \frac{C_S}{C_f} * (1 + \delta). \quad (14)$$

Additionally, if the input current $I_{IN}$ and load current $I_{LOAD}$ are:

$$I_{IN} = I_0 - m*I_{TS} \quad (15)$$

$$I_{LOAD} = I_0 + m*I_{TS}, \quad (16)$$

then the gain GS of amplifier 402 is:

$$GS = G_0 e^{m*\frac{n*I_C*T_S}{I_0}}. \quad (17)$$

The resulting output voltage VOUT would then be:

$$VOUT \approx VIN * \frac{CS}{CF} * \left(1 + \delta - e^{\frac{-T_S}{3\tau}} - a*k*GS\right) = \quad (18)$$

$$VIN * \frac{CS}{CF} * \left(1 + \delta - e^{\frac{-T_S}{3\tau}} - a*k*G_0*e^{m*\frac{n*I_C*T_C}{I_0}}\right)$$

While this configuration of FIG. 4 is less accurate than the configuration of FIG. 3, it is much simpler to implement because the gain of amplifier 402 is lower than the gain of amplifier 304 at higher speeds.

Having thus described the present invention by reference to certain of its preferred embodiments, it is noted that the embodiments disclosed are illustrative rather than limiting in nature and that a wide range of variations, modifications, changes, and substitutions are contemplated in the foregoing disclosure and, in some instances, some features of the present invention may be employed without a corresponding use of the other features. Accordingly, it is appropriate that the appended claims be construed broadly and in a manner consistent with the scope of the invention.

The invention claimed is:

1. An apparatus comprising:
    a sampling capacitor that receives an input signal;
    a multiplying digital-to-analog converter (MDAC) amplifier having an input terminal and an output terminal, wherein the sampling capacitor is coupled to the input terminal of the MDAC amplifier;
    a feedback capacitor that is coupled between the input terminal of MDAC amplifier and the output terminal of the MDAC amplifier;
    a correction amplifier having:
        an attenuating amplifier having an input terminal and an output terminal, wherein the input terminal of the attenuating amplifier is coupled to the output terminal of the MDAC amplifier; and
        a settling amplifier having an input terminal and an output terminal, wherein the input terminal of the setting amplifier is coupled to the output terminal of the attenuating amplifier so as to at least apply a settling gain to an output signal from the MDAC amplifier; and
    a correction capacitor that is coupled between the output terminal of the correction amplifier and the input terminal of the MDAC amplifier, wherein the capacitance of the correction amplifier is a fraction of the capacitance of the feedback capacitor.

2. The apparatus of claim 1, wherein the setting gain is negative.

3. An apparatus comprising:
    a first set of stage coupled in series with one another that receives an analog input signal, wherein the stage from the first set of stages includes:
    a first analog-to-digital converter (ADC); and
    an MDAC having:
        a sampling capacitor that is coupled to the first ADC;
        a MDAC amplifier having an input terminal and an output terminal, wherein the sampling capacitor is coupled to the input terminal of the MDAC amplifier;
        a feedback capacitor that is coupled between the input terminal of MDAC amplifier and the output terminal of the MDAC amplifier;
        a correction amplifier having:
            an attenuating amplifier having an input terminal and an output terminal, wherein the input terminal of the attenuating amplifier is coupled to the output terminal of the MDAC amplifier; and
            a settling amplifier having an input terminal and an output terminal, wherein the input terminal of the setting amplifier is coupled to the output terminal of the attenuating amplifier so as to at least apply a settling gain to an output signal from the MDAC amplifier; and a correction capacitor that is coupled between the output terminal of the correction amplifier and the input terminal of the MDAC amplifier, wherein the capacitance of the correction amplifier is a fraction of the capacitance of the feedback capacitor;

a final stage that is coupled to at least one of the stages from the first set of stages, wherein the final stage includes a second ADC; and output circuitry is coupled to each of the first ADCs and to the second ADC, wherein the output circuitry outputs a digital signal.

4. The apparatus of claim 3, wherein each stage from the first set of stages further comprises:

a track-and-hold (T/H) amplifier that is coupled to the first ADC;

an adder that is coupled to the T/H amplifier and to the MDAC; and a residue amplifier that is coupled to the adder.

5. The apparatus of claim 4, wherein the setting gain is negative.

6. A method comprising:

sampling an input signal on a sampling capacitor;

amplifying a sampled voltage from the sampling capacitor with an MDAC amplifier;

feeding back an output of the MDAC amplifier to an input terminal of the MDAC amplifier through a feedback capacitor;

attenuating the output of the MDAC amplifier to generate an attenuated output;

applying a settling gain to the attenuated output; and feeding back a settled output to the input terminal of the MDAC through a correction capacitor, wherein the capacitance of the correction capacitor is a fraction of the capacitance of the feedback capacitor.

7. The method of claim 6, wherein the setting gain is negative.

* * * * *